(12) United States Patent
Kaveh et al.

(10) Patent No.: US 8,744,624 B1
(45) Date of Patent: Jun. 3, 2014

(54) SUBSTRATE ALIGNMENT SYSTEM

(75) Inventors: Farro Kaveh, Palo Alto, CA (US); Martin P. Aalund, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 2452 days.

(21) Appl. No.: 11/382,721

(22) Filed: May 11, 2006

(51) Int. Cl.
*G06F 19/00* (2011.01)

(52) U.S. Cl.
USPC ............ 700/245; 356/237.1; 356/237.5; 702/153

(58) Field of Classification Search
USPC ............ 700/245; 356/237.1, 237.5; 702/153
See application file for complete search history.

(56) References Cited

U.S. PATENT DOCUMENTS

| | | | | |
|---|---|---|---|---|
| 4,611,292 A | * | 9/1986 | Ninomiya et al. | 702/153 |
| 5,836,872 A | * | 11/1998 | Kenet et al. | 600/306 |
| 5,864,114 A | * | 1/1999 | Fukuda | 219/121.83 |
| 6,137,303 A | * | 10/2000 | Deckert et al. | 324/757.03 |
| 6,282,459 B1 | * | 8/2001 | Ballantine et al. | 700/245 |
| 6,346,942 B1 | * | 2/2002 | Endo et al. | 345/427 |
| 6,389,688 B1 | * | 5/2002 | Srivastava et al. | 29/833 |
| 6,415,397 B1 | * | 7/2002 | Co et al. | 714/42 |
| 6,466,841 B2 | * | 10/2002 | DiStasio et al. | 700/213 |
| 6,603,103 B1 | * | 8/2003 | Ulrich et al. | 250/205 |
| 6,630,996 B2 | * | 10/2003 | Rao et al. | 356/237.5 |
| 7,085,622 B2 | * | 8/2006 | Sadighi et al. | 700/245 |
| 7,239,932 B2 | * | 7/2007 | Farnworth | 700/118 |
| 7,329,114 B2 | * | 2/2008 | Harper et al. | 425/385 |

* cited by examiner

*Primary Examiner* — Thomas Black
*Assistant Examiner* — Wae Louie
(74) *Attorney, Agent, or Firm* — Luedeka Neely Group, P.C.; Rick Barnes

(57) ABSTRACT

A substrate loading system, having a vision system adapted to view a substrate and provide position signals indicative of substrate position. A controller receives the position signals from the vision system, determines the substrate position, and sends transport signals to a robot arm. The robot arm engages the substrate in a beginning location and a beginning position and transports the substrate to a desired location and a desired position, based at least in part on the transport signals received from the controller.

20 Claims, 1 Drawing Sheet

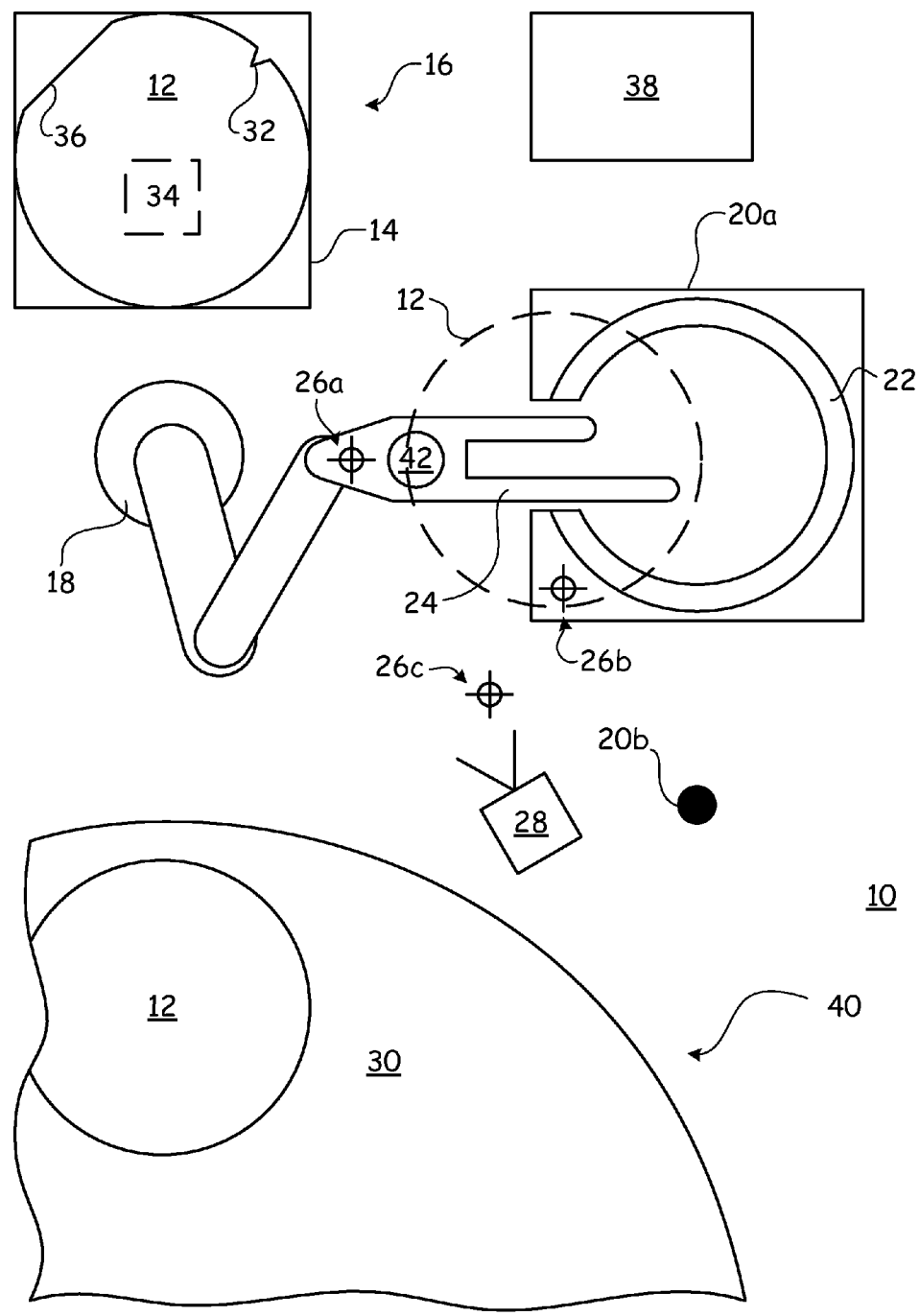

SUBSTRATE ALIGNMENT SYSTEM

FIELD

This invention relates to the field of integrated circuit fabrication. More particularly, this invention relates to substrate handling during integrated circuit fabrication.

BACKGROUND

Modern integrated circuits are customarily fabricated on substantially round slices of a semiconductor or other material, commonly called substrates or wafers. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

In many instances during the fabrication process it is desired to place the substrate within a piece of processing equipment or a piece of inspection equipment (jointly and severally referred to as "tools" herein) in a desired position. As the term is used herein, "position" refers to two components. The first component is offset, or in other words the x,y,z location of the substrate within the plane defined by the substrate. The second component is orientation, or in other words the disposition of the substrate with respect to rotation within the plane, or the pitch and yaw of the plane as determined by a reference. It is understood that the term "position" could also refer to other components of location of an object within a three-dimensional space, but the two components described above are of primary importance in the discussion presented herein.

Currently, a variety of methods are used to place a substrate in a desire position. Formerly, the substrate would be placed on a rotating chuck and the edge of the substrate would be rotated against a physical element, such as a pin, that senses a notch or flat in the circumferential edge of the substrate as it rotates past the physical element. The substrate is then placed in a position with respect to the notch. More recently, the substrate is rotated at a relatively high rate of speed with the circumferential edge of the substrate disposed under a linear CCD element that finds the notch. The rotation again a physical element or the high rate of rotation requires that the substrate be retained to the chuck, such as by being gripped at the edge or by a vacuum chuck, but not by gravity alone.

Unfortunately, adding such pre-aligner systems to all the tools that might benefit from their use can be quite expensive, in a variety of different ways. Current pre-aligner systems have a relatively high cost of more than about six thousand dollars each, are prone to failure, and take up valuable space. What is needed, therefore, is a system that overcomes problems such as those described above, at least in part.

SUMMARY

The above and other needs are met by a substrate loading system, having a vision system adapted to view a substrate and provide position signals indicative of substrate position. A controller receives the position signals from the vision system, determines the substrate position, and sends transport signals to a robot arm. The robot arm engages the substrate in a beginning location and a beginning position and transports the substrate to a desired location and a desired position, based at least in part on the transport signals received from the controller.

In this manner an expensive pre-alignment system is not required. Instead, a robot arm and a vision system can be used to transport and position the substrate. Many loading mechanisms already have robot arms, and thus only a vision system needs to be added, with appropriate programming and control of the robot arm, to adapt the equipment to this new system. Thus, implementation of the present system can be very cost effective.

In various embodiments, the beginning location of the substrate is a cassette and the desired location of the substrate is within a tool. Preferably, the beginning position and the desired position have common pitch and yaw components. In some embodiments, a fiducial is commonly viewed with the substrate by the vision system to provide referenced position signals. The fiducial may be disposed on the robot arm or on an element other than the robot arm and the vision system, which other element is in a known location and position relative to the vision system. The robot arm preferably retains the substrate with gravity alone. Some embodiments use an intermediate stage on which the robot arm places the substrate, releases the substrate, and re-engages the substrate from a different orientation, in order to position the substrate in the desired location in the desire position. In various embodiments, the means that is used to determine the substrate position is at least one of a flat on the substrate, a notch on the substrate, and circuit elements on the substrate.

According to another aspect of the invention there is described a method of transporting a substrate from a beginning location and a beginning position to a desired location and a desired position, by: (a) viewing a substrate with a vision system, (b) providing position signals indicative of substrate position, (c) receiving the position signals from the vision system with a controller, (d) determining the substrate position with the controller, (e) sending transport signals to a robot arm from the controller, (f) engaging the substrate with the robot arm in the beginning location and the beginning position, and (g) transporting the substrate with the robot arm to the desired location and the desired position, based at least in part on the transport signals received from the controller. In various embodiments, the steps of the method are performed in the listed order. Alternately, step (f) is performed prior to the other steps as listed.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which is a top plan view of a system according to a preferred embodiment of the present invention.

DETAILED DESCRIPTION

The various embodiments of the invention as described herein take advantage of existing mechanisms in a robot 18, such as a dual yaw manufactured by Yaskawa Electric Corporation of Kitakyushu, Japan, with the addition of a vision system 28, such as those manufactured by Cognex Corporation of Natick, Mass. The combined robot 18 and vision system 28 preferably determines the position of the substrate 12 to be aligned, and then places the substrate 12 in a desired location 40, and in a desired position within that location 40.

This system 10, especially for tools that do not require orientation and alignment of the substrate 12, provides a faster means to transfer the substrate 12 from a cassette 14 or other holder, such as in a front opening unified pod, to the stage 30 of the tool. The stage 30 as displayed in the FIGURE is only partially depicted. Although many different beginning 16 and ending points 40 for the substrate 12 are contemplated herein, all such will be exemplified by moving the substrate 12 from a cassette 14 to a stage 30, where the cassette 14 is the beginning location 16 where the substrate 12 is in a substantially unknown position, and the stage 30 is the ending location 40 where the substrate 12 is in a substantially desired position.

In its most basic embodiment, the invention places a substrate 12 in a position by picking up the substrate 12 from a starting location 16 with a robot arm 18, determining the position of the substrate 12 with the vision system 28, and transporting the substrate 12 to a desired location 40 and in a desired position with the robot arm 28. Thus, a vision system 28 is used to determine the position of the substrate 12, instead of using a mechanical method to determine the position of the substrate 12.

As depicted in the FIGURE, the vision system 28 preferably looks down on the rest of the system 10, and views it from above, although other references are also contemplated hereunder. Thus, the vision system 28 may have a different field of view than that as depicted in the FIGURE, which is limited to a two dimensional representation of the system 10.

The step of determining the position of the substrate 12 can be accomplished at any point in the process. For example, the vision system 28 could determine the position of the substrate 12 before it is engaged by the robot arm 18, and the robot arm 18 could then move the substrate 12 to the desired location 40 and position. Alternately, the robot arm 18 could engage the substrate 12 and move it to a given location 20 within the field of view of the vision system 28, which then determines the position of the substrate 12, and the robot arm 18 then delivers the substrate 12 to the desired location 40 in the desired position. Further, the robot arm 18 could engage the substrate 12 and move it to the desired location 20, where the vision system 28 determines the position of the substrate 12, and the robot arm 18 then moves the substrate 12 into the desired position in that location 20. Thus, there are many different ways in which the system 10 could be implemented.

Typically, some components of the position of the substrate 12 in the starting location 16 will be known. For example, a substrate 12 that is taken from a cassette 14 as a starting location 16 will typically be in a relatively known x,y,z position. Thus, the vision system 28 in such an embodiment would not be required for the robot arm 18 to merely engage the substrate 12, because only the rotational component of the position of the substrate 12 is not known. However, in other embodiments, fewer components of the starting position of the substrate 12 may be known, and it is conceivable that in some embodiments, none of the components of the starting position of the substrate 12 are known, except that the substrate 12 resides somewhere within a given volume of space. In that embodiment, the vision system 28 would preferably be used to determine the starting location 16 and position of the substrate 12 prior to engagement by the robot arm 18.

The more complex case is when both components of the position of the substrate 12, offset and orientation, are desired. In this case, the substrate 12 in one embodiment is picked up from the cassette 14 by an end effector 24 and placed in an intermediate location 20, such as a holding ring 20a. The substrate 12 is then picked up off of the holding ring 20a with a chuck 42 on the robot arm 18, and is viewed with the vision system 28 to determine the position of the substrate 12 as held by the robot arm 18, such as by finding the center of the substrate 12 to determine the offset, and the notch 32 of the substrate 12 to determine the orientation. Of course, other elements of the substrate 12 could be used to determine both the offset and the orientation of the substrate 12.

The chuck 42 is preferably attached to the wrist of the robot arm 18, and may be provided with proper vacuum levels from the robot supply so as to selectively retain the substrate 12. However, in more preferred embodiments, the substrate 12 is retained on the chuck 42 by gravity alone. The chuck 42 may be fitted with one or more pad or o-ring of rubber or some thermoplastic material, to help with the gravity retention of the substrate 12 as it is rotated. The substrate 12 position with respect to both offset and orientation is now known in relation to the position of the robot arm 18, and the substrate 12 may be rotated as desired using the robot chuck 42 until the substrate 12 is disposed in a desired orientation with respect to the robot arm 18. Most preferably, the substrate 12 is rotated at a relatively low rate of speed, so that no mechanical means such as vacuum or edge gripping is required to retain the substrate 12 against the chuck 42 during the rotation.

The substrate 12 is placed back onto the holding ring 20a, with the desired rotational orientation between the substrate 12 and the holding ring 20a, and with the desired offset between the substrate 12 and the holding ring 20a, so that the substrate 12 can be picked up directly by the end effector 24 and delivered to the stage 30 of the given tool.

In an alternate version, the vision system 28 views the substrate 12 while it is in the initial position 16, and the controller 38 determines the location of at least one of the notch 32, the flat 36, or other elements 34 on the substrate 12, thus determining the position of the substrate 12. The robot arm 18 picks up the substrate 12, and by virtue of the articulation in the arms of the robot arm 18, is able to place the substrate 12 on the platen 30, or other ending location 40, in the correct position. The controller 38 computes how the orientation of the substrate 12 must be changed by the robot arm 18 from where it is picked up in the cassette 14 to where it is set down on the platen 30. The change in orientation can be effected entirely within the articulation or natural rotation of the robot arm 18, or by a rotating element 42 on the robot arm 18, or by setting the substrate down on an intermediate element 20 and then picking it back up with the robot arm 18 from a new direction, so that the articulation of the robot arm 18 is then sufficient to place the substrate 12 in the desired position on the platen 30.

In another version, the holding ring 20a can be designed to self center the substrate 12 when it is placed there in its orientated state by the robot arm 18. In this embodiment, the orientation is provided by the robot arm 18 and vision system 28, and the offset is provided by the self centering ring, such as by an indentation 22 in the ring 20a in which the substrate 12 settles as it is placed thereon.

In yet another version, the substrate 12 is picked from the cassette 14 directly by the robot arm 18, viewed with the viewing system 28 to determine the position of the substrate 12, and placed directly by the robot arm 18 onto the stage 30 of the tool in the desired offset and orientation, as determined from the viewing system 28. In this embodiment, no other loading mechanisms or intermediate holding structures are required.

In a different embodiment, the substrate 12 orientation and offset are not critical. In this case the vision system 28 determines the position of the substrate 12, after the substrate 12 is picked up from the cassette 14. This information is communicated to the controller 38 for correction of the position of the substrate 12 on the stage 30, as desired.

With the embodiments of this invention, the costly pre aligner is eliminated, and with minor changes to the existing robot 18 geometry on the tool and with programming and addition of a vision system 28, such as a charge couple device array or a camera, the same functions are accomplished.

In another embodiment, the substrate 12 is passed under a vision system 28 that has sufficient fields of view to see both a fiducial 26a that is mounted to the end-effector 24 or wrist of the robot 28 and elements of the substrate 12 from which at least one of offset and orientation can be determined, such as the notch 32, flat 36, or circuit elements 34. The relative offset and orientation of that element is then determined. The robot 18 then places the substrate 12 on a passive stage 20b of the tool, and uses its redundant degree of freedom to pick up the substrate 12 again such that the substrate 12 is delivered to the stage 30 in the desired position. This approach preferably uses a robot 12 with an articulated wrist or additional degree of freedom to correct the orientation. Fortunately, many robots 18 used in dual and triple tool front end module systems already have this extra degree of freedom to eliminate a track.

Another embodiment utilizes a vision 28 system with a smaller field of view. In this embodiment, the robot 18 moves the edge of the substrate 12 under the vision system 28, and continues to move the substrate 12 edge under the vision system 28 until a position-indicating element such as the notch 32 is detected. Position information from the robots positional sensors coupled with position information for the substrate 12 from the vision system 28 is used to determine the substrate 12 offset and orientation in regard to stage 30. This data is used to place the substrate 30 on the stage 12 in the desired position using the robot 18. This approach preferably uses a robot 18 with an articulated wrist or additional degree of freedom.

Another embodiment uses the system 10 as described above where one of the orientation and offset is adjusted by the stage 30 on which the substrate 12 is finally disposed. The vision system 28 and robot 18 are preferably used to locate and determine at least one of the orientation and offset of the substrate 12 as it is held by the robot 18. In one embodiment the robot 18 corrects the offset when it places the substrate 12 onto the stage 30, and the stage 30 then adjusts the orientation based on the data received from the vision system 28. This embodiment can be implemented by a standard R, Z, Theta robot 18, and does not require and additional degree of freedom, since the stage 30 is used to adjust the orientation of the substrate 12. In another embodiment the robot 18 corrects the orientation when it places the substrate 12 onto the stage 30, and the stage 30 then adjusts the offset, either using the data received from the vision system 28, or in a simple mechanical method, such as adjusting the location of the substrate 12 with pins or indentations in the stage 30.

In one embodiment, a different type of sensor is used to "view" the substrate 12 instead of the vision system 28 and determine position information, such as an inductive sensor or a capacitive sensor that can detect the notch 32 or flat 36. However, a vision system 28 can detect other elements besides the notch 32 or the flat 36, such as the circuit elements 34, to determine the position of the substrate.

In another embodiment, a fiducial 26b or 26c is fixed in space relative to the vision system 28. The robot 18's position is preferably used in addition to the vision system 28 to determine the offset and orientation of the substrate 12. Alternately, fixed lights, such as mounted on the tool, could be used to determine the substrate 12 position and orientation. Again, either the robot 18 or the stage 30 could be used to correct the offset and orientation of the substrate 12.

It is generally desired to be able to determine the position of the substrate 12 relative to something known using the vision system 28, and then deliver the substrate 12 in a desired position to the stage 30. Thus, two positions are preferably determined, that of the substrate 12, and that of the "something known." In the preferred embodiments, the something known is the robot 18, but it could be something else in other embodiments.

The position of the substrate 12 can be determined by finding the notch 32 on the substrate. However, it can also be determined by inspecting for other physical elements, such as a flat 36 on the substrate 12. Further, the position of the substrate 12 could be determined by looking at the patterns of circuitry 34 on the substrate 12. Thus, the vision system 28 can be used to inspect the substrate 12 for one or more of a variety of different elements by which the position of the substrate 12 can be determined.

The position of the robot arm 18 can likewise be determined according to one or more of a variety of different methods. For example, the robot arm 18 can be calibrated or otherwise "zeroed" to a home position, and then all subsequent movements of the robot arm 18 can be tracked so that the position of the robot 18 at any given time can be determined. This could be referred to as an internal position determination, as the position of the robot 18 is determined by the internal workings of the robot 18 itself.

The position of the robot 18 could also be determined by one or more external method. For example, a fiducial 26a could be placed on the robot 18, and the position of the fiducial 26a could be determined by the vision system 28, thus determining the position of the robot 18. Alternately, a given existing element of the robot 18 could be tracked by the vision system 28, thereby determining the position of the robot 18. Either of these external methods could be assisted by the use of a fiducial 26b or 26c that is mounted on something other than the robot arm 18, such as a fixed element 20a, which can be used as a reference to determine the position of the robot arm 18, such as by using the fiducial 26a on the robot arm 18. It will be appreciated that other fixed elements besides a fiducial 26b or 26c could also be used as a reference.

The position of the robot 18 and the substrate 12 could be determined more or less simultaneously, such as by using a vision system 28 with a relatively broader field of view, or one at a time, such as by using a vision system 28 with a relatively narrower field of view. Once the positions of both the robot 18 and the substrate 12 are determined, the substrate 12 can be placed on the stage 30 in any position desired, relative to the stage 30, the position of which is known to the system 10. However, if the vision system 28 has a field of view that includes both the stage 30 and the substrate 12, then the position of the robot 18 becomes somewhat irrelevant, as the position of the substrate 12 relative to the stage 30 can be directly determined, and the substrate 12 placed on the stage 30 in the desired position.

Because many tools already include a robot 18 for loading and unloading the tool, the system 10 as described herein preferably adds only a vision system 28 and a controller 38 to the cost of the tool, while saving the cost of the pre-alignment system, as described above. Most tools also already include processing systems, such as general purpose computers, which can be used for the controller 38 to process the algorithms for position determination as described above. Thus, only the addition of the vision system 28 is needed. Further, even existing robots 18 with more limited capabilities, as described above, can be used to implement the system 10 as described herein, while robots 18 with more advanced capabilities can also be used to the benefit of the present system 10.

The types of robots 18 predominantly contemplated herein are those such as having two, three, or four arm segments that are rotatably connected one to another at distal ends of the arm segments. One end of a first arm segment is mounted, such as to the tool or to some other relatively fixed apparatus at the substrate 12 entrance to the tool. One end of a last arm segment preferably has a chuck 42 or other means 24 for engaging a substrate 12 so that it can be moved using the robot 18. Most preferably, the chuck 42 is rotatable on the end of the last arm segment. The robot 18 is preferably able to move the substrate 12 up and down in a z direction, to at least a limited extent, which might be as little as a few millimeters. In some cases, the robot 18 may have the ability to adjust the pitch and yaw of the substrate 12, although such movement is typically not needed.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A substrate loading system, comprising:
    a vision system adapted to view a substrate and provide position signals indicative of substrate position,
    a controller adapted to receive the position signals from the vision system, determine the substrate position, and send transport signals to a robot arm, and
    the robot arm adapted to engage the substrate in a beginning location and a beginning position and transport the substrate to a desired location in a desired position, based at least in part on the transport signals received from the controller.

2. The substrate loading system of claim 1, wherein the beginning location of the substrate is a cassette.

3. The substrate loading system of claim 1, wherein the desired location of the substrate is within a tool.

4. The substrate loading system of claim 1, wherein the beginning position and the desired position have common pitch and yaw components.

5. The substrate loading system of claim 1, further comprising a fiducial that is commonly viewed with the substrate by the vision system to provide referenced position signals.

6. The substrate loading system of claim 5, wherein the fiducial is disposed on the robot arm.

7. The substrate loading system of claim 5, wherein the fiducial is disposed on an element other than the robot arm and the vision system, which other element is in a known location and position relative to the vision system.

8. The substrate loading system of claim 1, wherein the robot arm retains the substrate with gravity alone.

9. The substrate loading system of claim 1, further comprising an intermediate stage on which the robot arm places the substrate, releases the substrate, and re-engages the substrate from a different orientation, in order to position the substrate in the desired location in the desire position.

10. The substrate loading system of claim 1, wherein a flat on the substrate is used to determine the substrate position.

11. The substrate loading system of claim 1, wherein a notch on the substrate is used to determine the substrate position.

12. The substrate loading system of claim 1, wherein circuit elements on the substrate are used to determine the substrate position.

13. A method of transporting a substrate from a beginning location and a beginning position to a desired location and a desired position, the method comprising the steps of:
    (a) viewing a substrate with a vision system,
    (b) providing position signals indicative of substrate position,
    (c) receiving the position signals from the vision system with a controller,
    (d) determining the substrate position with the controller,
    (e) sending transport signals to a robot arm from the controller,
    (f) engaging the substrate with the robot arm in the beginning location and the beginning position, and
    (g) transporting the substrate with the robot arm to the desired location and the desired position, based at least in part on the transport signals received from the controller.

14. The method of claim 13, wherein the steps of the method are performed in the listed order.

15. The method of claim 13, wherein step (f) is performed prior to all other steps as listed.

16. The method of claim 13, wherein the beginning location of the substrate is a cassette and the desired location of the substrate is within a tool.

17. The method of claim 13, wherein the beginning position and the desired position have common pitch and yaw components.

18. The method of claim 13, further comprising the step of commonly viewing a fiducial with the substrate by the vision system to provide referenced position signals to the controller.

19. The method of claim 13, further comprising the steps of placing the substrate on an intermediate stage with the robot arm, releasing the substrate, and re-engaging the substrate from a different orientation, in order to transport the substrate to the desired location in the desire position.

20. The method of claim 13, wherein the step of determining the substrate position is accomplished with the use of at least one of a flat on the substrate, a notch on the substrate, and circuit elements on the substrate.

* * * * *